United States Patent [19]

Bohmer

[11] Patent Number: 5,033,824
[45] Date of Patent: Jul. 23, 1991

[54] CONVERTIBLE ANALOG-DIGITAL MODE DISPLAY DEVICE

[75] Inventor: William Bohmer, Succasunna, N.J.

[73] Assignee: Display Matrix Corporation, Randolph, N.J.

[21] Appl. No.: 561,624

[22] Filed: Aug. 2, 1990

[51] Int. Cl.$^5$ .............................................. G02F 1/133
[52] U.S. Cl. ................................ 350/336; 350/331 R; 340/765
[58] Field of Search .................... 350/331 R, 332, 333, 350/334, 336; 340/752, 718, 765, 784, 815.2; 439/65–67; 338/48, 254, 307, 308

[56] References Cited

U.S. PATENT DOCUMENTS

| | | | |
|---|---|---|---|
| 3,820,875 | 6/1974 | Bohmer | 350/336 |
| 3,834,794 | 9/1974 | Soref | 350/336 |
| 4,365,868 | 12/1982 | Richardson | 350/336 |
| 4,493,531 | 1/1985 | Bohmer et al. | 350/336 |
| 4,516,835 | 5/1985 | Suzuki et al. | 350/336 |
| 4,586,879 | 5/1986 | Kishimoto et al. | 350/336 |
| 4,804,251 | 2/1989 | Jacobs | 350/336 |
| 4,896,946 | 1/1990 | Suzuki et al. | 350/336 |

FOREIGN PATENT DOCUMENTS 2100017 12/1982 United Kingdom ................ 350/336

Primary Examiner—Stanley D. Miller
Assistant Examiner—Tai V. Duong
Attorney, Agent, or Firm—Kenyon & Kenyon

[57] ABSTRACT

A display element that can be used in either an analog or a digital liquid crystal display device includes an electrically insulating substrate having a surface with a display region and at least one elongated connection region outside the display region. The one connection region includes a longitudinally extending digital connection section and a longitudinally extending analog connection section. Discrete display-generating electrically conductive electrodes are disposed in the display region of the substrate in spaced-apart relation in a predetermined pattern, and an equal number of electrically conductive connector strips are disposed on the substrate in both the analog and digital connection sections, each one of the connector strips being uniquely connected to a respective one of the display-generating electrodes, and all of the connector strips being formed with edges that extend only transversely to the longitudinal dimension of the connection region in the digital connection section, and selected pairs of adjacent connector strips being formed with portions that are aligned in the transverse direction of the connection region in the analog connection section such that a transverse line will intersect portions of both connector strips of each pair in the analog connection section. Conventional laminated elastomeric connector elements can be used to connect individual display-generating electrodes to separate outside circuits via the respective connector strips in the digital connection section to create a digital type of display or, alternatively, to connect the selected adjacent pairs of connector strips together to form a continuous resistive electrode of predetermined pattern for creating an analog type of display.

9 Claims, 6 Drawing Sheets

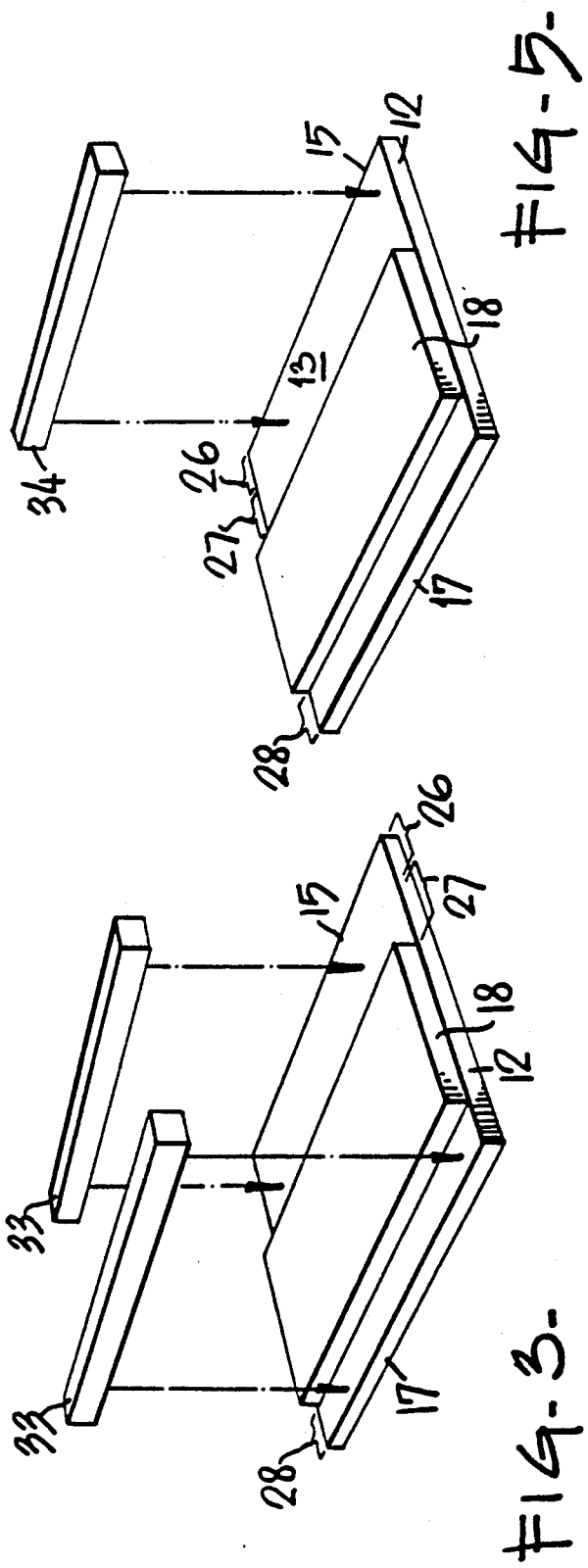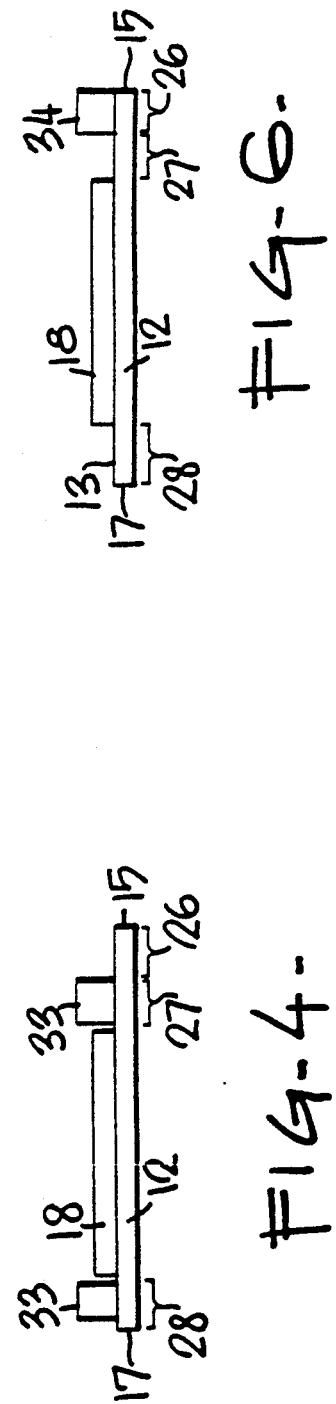

CONVERTIBLE ANALOG-DIGITAL MODE DISPLAY DEVICE

BACKGROUND OF THE INVENTION

1. Field of the Invention

The present invention relates to liquid crystal display devices, and particularly to electrode arrangements for such devices.

2. Description of the Prior Art

Various types of liquid crystal displays are known which convey information in either only analog form or only digital form. The applicant's U.S. Pat. No. 3,820,875, which issued on June 28, 1974, discloses an analog type of scanner device having a field-effect light-scattering dielectric (e.g., a liquid crystal material) disposed between a pair of electrically insulative plates or substrates. The inner surface of one of the plates supports a resistor of predetermined length and configuration; the inner surface of the other plate supports a substantially nonresistive conductor, facing the resistor. At least one of the one plate and resistor and the other plate and conductor are transparent, so that the dielectric is visible through at least one of the plates.

A first voltage difference applied to the ends of the resistor produces a voltage gradient along the length of the resistor. Selective adjustment of a second voltage applied to the conductor to change the location on the one plate where the gradient voltage equals the conductor voltage renders the dielectric at that location visually distinguishable from the dielectric in the rest of the space between the plates. The patent discloses two different resistor patterns. The first is a continuous zig-zag pattern of spaced parallel lines, with successive adjacent pairs of the lines being joined together at alternate ends to form a rectangular serpentine array. A potential difference applied to the two ends of the array produces a voltage gradient that is a continuously varying function along the length of the zig-zag resistive pattern, from one end of the array to the other, so that any point located on the pattern is defined by a unique voltage.

In the second pattern, a straight resistor element extends along one edge of a plate, and a number of parallel spaced-apart low resistance conductor strips extend perpendicularly from the resistor across the plate, forming a rectangular array. A potential difference applied to the opposite ends of the resistor element in this arrangement also produces a continuous voltage gradient along the length of the element. Since the individual conductor strips contact the resistive element at different discrete voltage points along its length, each conductor strip will be defined by a unique voltage that differs from the voltage of a neighboring strip by the voltage difference between adjacent strip connection points on the resistive element.

The patent discloses a three-plate embodiment that includes a first plate having resistor patterns of the second type on both sides, but with the parallel conductor strips on one side extending in a direction perpendicular to the parallel conductor strips on the other side. The first plate is sandwiched between second and third plates, spaced from the respective faces of the first plate and each having a substantially nonresistive conductive film on the inner surface facing the respective series of parallel conductor strips. The spaces between the plates are filled with a field effect light scattering dielectric.

A potential difference impressed on the ends of either resistor and an intermediate voltage applied to the facing conductive film produce a linearly extending visually distinguishable region in the dielectric between them at a location where the potential of a conductor strip equals the voltage applied to the facing conductive film. If the dielectric is a liquid crystal, the visually distinguishable region normally is a transparent region. Since the transparent lines formed in the dielectrics on the opposite sides of the one plate are perpendicular to each other, only their intersection is transparent to light passing through both dielectrics. Thus a window is created at the intersection that appears as a visually distinguishable spot. When varying voltages are applied to the conductive films on the second and third plates, the spot can be selectively scanned over the display.

U.S. Pat. No. 4,493,531 of Bohmer et al., issued on Jan. 15, 1985, introduces several alternative embodiments of the field-sensitive optical display devices described above. These further embodiments include further layers, including polarizing films, so that the devices can produce various analog patterns such as a movable dot, intersecting lines, and a pivoting line.

There are also well known types of liquid crystal digital displays that employ patterns of isolated or discrete elements that are individually addressed by external circuitry. An example is the common digital watch display format that uses a rectangular arrangement of seven segmental elements to create numbers and letters by addressing selected ones of the seven elements. Another example is a variant of the three-plate arrangement described above that has a first series of closely spaced parallel conductive strips or lines on one side of an insulative substrate and a second series of closely spaced parallel conductive lines on the other side of the substrate. Instead of connecting the individual conductive lines of each series to a resistor having a terminal at each end, each of the lines has a separate connector at an edge of the substrate to permit the lines to be individually addressed to form a dot matrix display.

Typically the pattern elements of a liquid crystal display device, whether analog or digital, are created by depositing an appropriate material, for example, indium-tin oxide, on the plate. Once a pattern is deposited, its type is fixed; it cannot be changed from a discrete point voltage type to the discrete line voltage type, or vice-versa. In addition, to operate a digital display device in analog mode, for example, it would be necessary to connect external resistors between the isolated elements of the digital display. This would negate the simplicity and minimum number of external connection terminals that are a feature of the analog display devices.

SUMMARY OF THE INVENTION

It is an object of the present invention, therefore, to provide a display pattern element that is adaptable for use in a liquid crystal display device in analog display mode, digital display mode, or partly in analog and partly in digital display mode.

It is a further object of the invention to provide a liquid crystal display device incorporating such a display pattern element that is easily convertible from analog to digital mode, and vice-versa.

These and other objects are achieved in a display element that is adapted for use selectively in either an analog or a digital liquid crystal display, the display element comprising:

an electrically insulating substrate having a surface subdivided into a display region and an elongated connection region outside the display region, the connection region including a longitudinally extending digital connection section and a longitudinally extending analog connection section;

a plurality of discrete display-generating electrodes composed of an electrically conductive material of preselected resistivity, the display-generating electrodes being disposed on the substrate in spaced-apart relation in a predetermined pattern in the display region; and a plurality of electrically conductive connector strips disposed on the substrate in the connection region and extending transversely in spaced-apart non-contacting relation across both the analog and digital connection sections, each one of the connector strips being uniquely connected to a respective one of the display-generating electrodes, and wherein all of the connector strips are formed with edges that extend only transversely to the longitudinal dimension of the connection region in the digital connection section, and wherein at least some pairs of adjacent connector strips are formed with portions that are aligned in the transverse direction of the connection region in the analog connection section such that a transverse line will intersect said portions of both connector strips of each pair in the analog connection section.

A convertible liquid crystal analog-digital display device incorporating a display element as defined above further comprises at least one elongated connector element disposed on the substrate and extending longitudinally in the connection region across a plurality of the connector strips, each connector element being formed of transverse laminations of alternate insulating and conductive films, the thicknesses of which are less than the spacing between adjacent connector strips in the digital connection section, and the width of the connector element being greater than the spacing between the transversely aligned portions of the connector strips in the analog connection section, such that when a connector element is located in the digital connection section it provides no electrical connection between the connector strips, and when a connector element is located in the analog connection section at least one of the conductive laminations will contact the transversely aligned portions of an adjacent pair of connector strips to provide an electrical connection between the respective discrete display-generating electrodes connected to said pair of connector strips.

In the preferred embodiments of the display element of the invention, the discrete display-generating electrodes are arranged in a rectangular array of parallel resistive strips, the connection region extending alongside the display region perpendicularly to the resistive display-generating electrode strips and with each connector strip forming an extension of a respective one of the discrete display-generating electrode strips. In one such embodiment, the substrate has an additional elongated connection region, the additional connection region also having a plurality of connector strips equal to the number of display-generating electrodes and including an analog connection section wherein portions of adjacent pairs of the connector strips are aligned transversely to the longitudinal dimension of the connection region, and the transversely aligned portions of adjacent pairs of connector strips in the analog connection section of the first-mentioned connection region alternate with the transversely aligned portions of adjacent pairs of connector strips in the analog connection section of the additional connection region, so that laminated connector elements disposed in the analog connection sections at the opposite ends of the display elements will electrically connect the opposite ends of alternate pairs of display elements to create a continuous zig-zag resistive analog display element.

Other such embodiments have a connection region located at only one end of the discrete display-generating electrode strips. Each connector strip in these embodiments includes an elongated resistive portion, each end of which is transversely aligned with an end of an adjacent connector strip and an intermediate portion of which is connected to the adjacent end of a corresponding one of the discrete display-generating electrode strips. In this arrangement, a laminated connector element disposed in the analog connection section at the one end of the display-generating electrode strips will electrically connect the transversely aligned ends of successive resistive portions of adjacent connector strips to create a continuous resistive element extending along one side of the display region and connected at spaced intervals along the resistive element to successive discrete display-generating electrode strips.

The above and other features of the invention will be described in more detail below in connection with the drawings.

BRIEF DESCRIPTION OF THE DRAWINGS

FIG. 3 is a perspective exploded schematic view of a display-generating device and connector element assembly for use in an analog display;

FIG. 4 is an end elevation view of the assembly of FIG. 3;

FIG. 5 is a perspective exploded schematic view of a display-generating device and connector element assembly for use in a digital display;

FIG. 6 is an end elevation view of the assembly of FIG. 5;

DETAILED DESCRIPTION OF THE PREFERRED EMBODIMENTS

Figure 1:
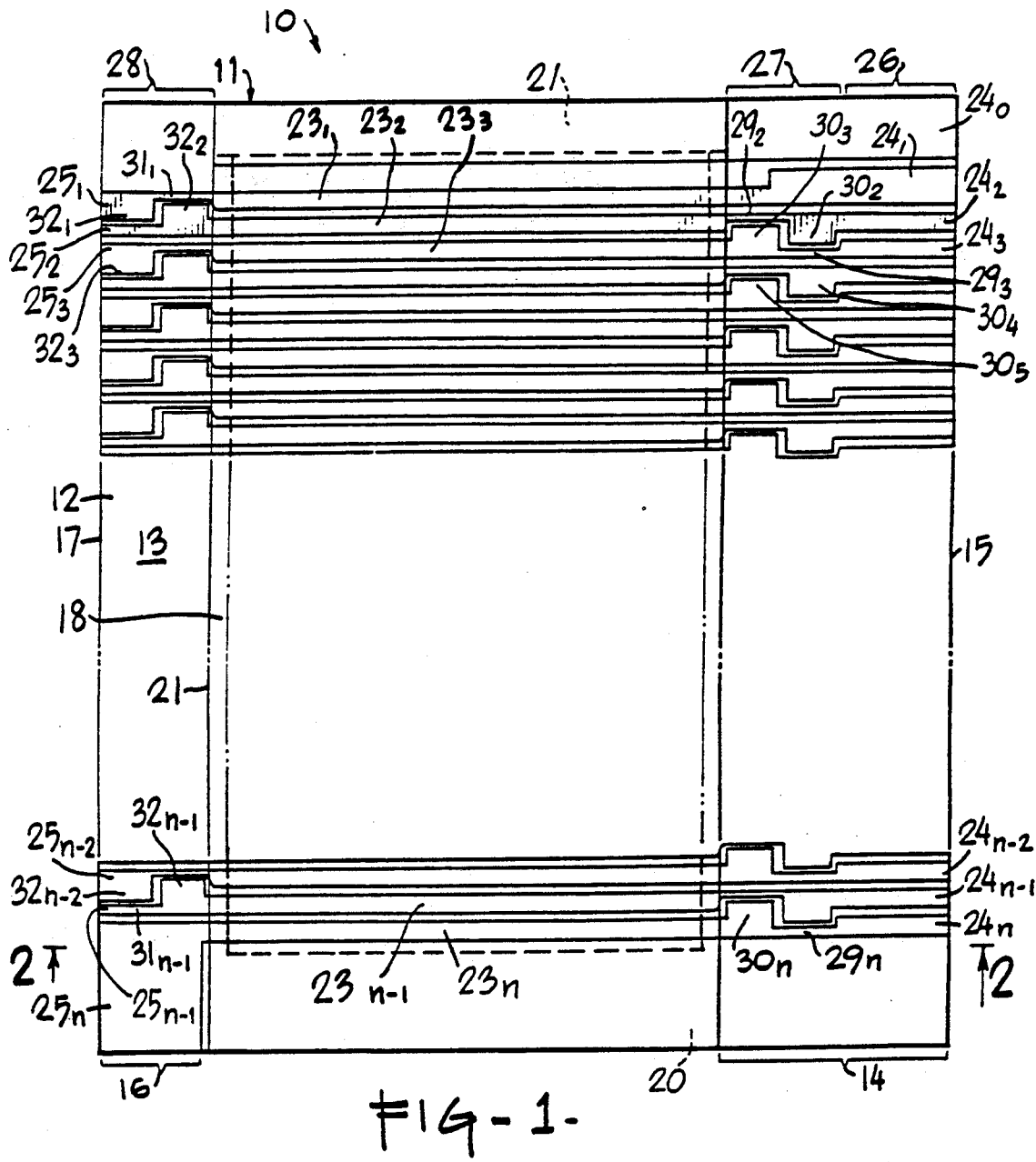
FIG. 1 is a plan view of a display-generating device according to the invention.
Figure 2:
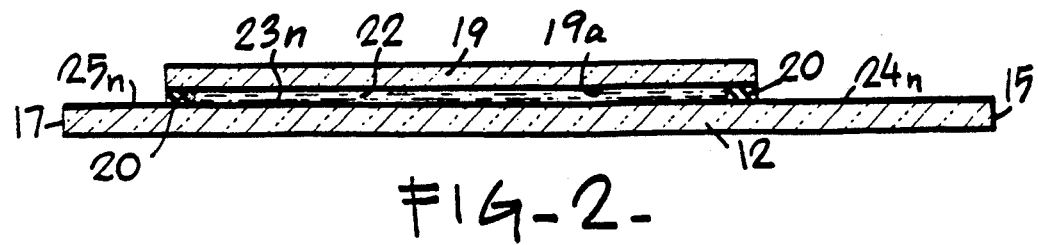
FIG. 2 is an end elevation view of the display-generating device of FIG. 1.

FIGS. 1 and 2 are plan and end elevation views, respectively, of a display device 10 having a convertible analog-digital electrode pattern according to the invention. The display device includes a display pattern element 11 comprising an electrically insulating substrate in the form of a first flat rectangular plate 12 having a surface 13 divided into three regions: a first elongated connection region 14 extending adjacent to one edge 15 of the first plate, a second elongated connection region 16 extending adjacent to an opposite edge 17 of the first plate, and a rectangular display region 18 between the first and second connection regions. A second flat rectangular plate 19 mounted on the first plate over the display region 18 has a conductive surface 19a, known as an address plate, facing the surface 13 of the first plate. The surface 19a of the second plate is spaced from the surface 13 of the first plate by nonconductive sealing strips 20 along the bottom and two side edges of the display and by a conductive sealing strip 21 along the top edge of the display, and the space between the plates is filled with a liquid crystal material 22.

A plurality of parallel spaced apart display-generating electrodes in the form of strips $23_1, 23_2, 23_3, \ldots, 23_n$ extend across the surface 13 of the first plate 12 from the first connection region 14 to the second connection region 16 to form a rectangular array. Each display-generating electrode strip 23 connects to respective first and second connector strips 24 and 25 that extend across the first and second connection regions 14 and 16 to the respective edges 15 and 17 of the first plate 12. In addition, a connection strip $24_0$ extends across the first connection region 14 plus the display region 18 to provide an electrical path to the address plate 19a via the conductive sealing strip 21.

The strips 23, 24, and 25 can be deposited on the substrate by any conventional technique used in the microelectronics field for depositing thin films. Typically, the first plate is made of glass, and the material of the strips 23, 24, and 25 deposited on the first plate is tin oxide, which is transparent in films of the thickness used in these elements. The width and thickness of each strip are selected to produce a desired resistance per unit length of the strip. The second plate may be made of a conductive material, but more typically it also is made of glass. In that case, the conductive surface 19a is a uniform thin-film conductive coating, which may also be indium-tin oxide.

The first connection region 14 is subdivided into two adjacent lengthwise sections of approximately equal width, a digital connection section 26 and an analog connection section 27. The width of the second connection region 16 is approximately half the width of the first connection region, and the second connection region contains only an analog connection section 28.

The portions of connector strips $24_0, 24_1, 24_2, 24_3, \ldots, 24_n$ in digital connection section 26 have constant widths, with parallel edges that extend transversely to the longitudinal direction of connection region 26. This arrangement permits the use of a laminated connector element to couple each connector strip 24 to a corresponding individual terminal for connection to external circuitry, as will be explained in connection with FIG. 11.

The portions of connector strips $24_2, 24_3, \ldots, 24_n$ in analog section 27 are divided into narrowed segments $29_2, 29_3, \ldots, 29_n$ and widened segments $30_2, 30_3, \ldots, 30_n$, respectively. The order of the narrowed segments 29 and the widened segments 30 is reversed in successive connector strips, so that the widened segments 30 of adjacent pairs of the connector strips form portions that are aligned in the transverse direction of the connection section 27 such that a transverse line will intersect these transversely aligned portions of both connector strips of each pair in the analog connection section. That is, portions $30_2$ and $30_3$ are transversely aligned; portions $30_4$ and $30_5$ are transversely aligned; and so on.

Connector strips $25_1, 25_2, \ldots, 25_{n-1}$ in analog connection section 28 are substantially mirror images of the portions of connector strips $24_2, 24_3, \ldots, 24_n$ in analog section 27. Thus, the connector strips 25 have narrowed segments $31_1, 31_2, \ldots, 31_{n-1}$ and widened segments $32_1, 32_2, \ldots, 32_{n-1}$, with the widened segments $32_1, 32_2, \ldots, 32_{n-1}$ of adjacent pairs of the connector strips $25_1, 25_2, \ldots, 25_{n-1}$ forming portions that also are aligned in the transverse direction. The adjacent pairs of connector strips 25 that have transversely aligned portions alternate with the adjacent pairs of connector strips 24 that have transversely aligned portions. Thus, connector strips $25_1$ and $25_2$ have transversely aligned portions $32_1$ and $32_2$, connector strips $24_2$ and $24_3$ have transversely aligned portions $30_2$ and $30_3$; and so on. This arrangement permits zig-zag connection of the electrode strips.

FIGS. 3-6 illustrate in schematic form the simple assembly concept of the invention that permits connection of the display element of FIGS. 1 and 2 to external circuitry as either a digital display or an analog display merely by selective placement of one or a pair of laminated connector elements. FIGS. 3 and 4 show how an analog display element is created by placing an elongated connector element 33 on each of the two analog connection sections 27 and 28. FIGS. 5 and 6 show how a digital display element is created by placing an elongated connector element 34 on the digital connection section 26.

As will be explained in more detail in connection with FIGS. 7 and 8, each connector element 33 or 34 is composed of numerous transverse laminations in the form of alternating electrically conductive and electrically insulating sheets. The electrically conductive sheets are films of carbon; the electrically insulating sheets are made of an elastomeric material. Such connector elements are known as elastomeric connector elements, or simply, as "elastomerics," and are sold, for example, under the trade mark "Zebra Strip" by FujiPoly, Inc. of Cranford, N.J. They find extensive use in the microelectronics field as connectors between fragile conductors on micro chips and corresponding terminals on printed circuit boards, the board terminals, in turn, being connected to other components.

Figure 7:
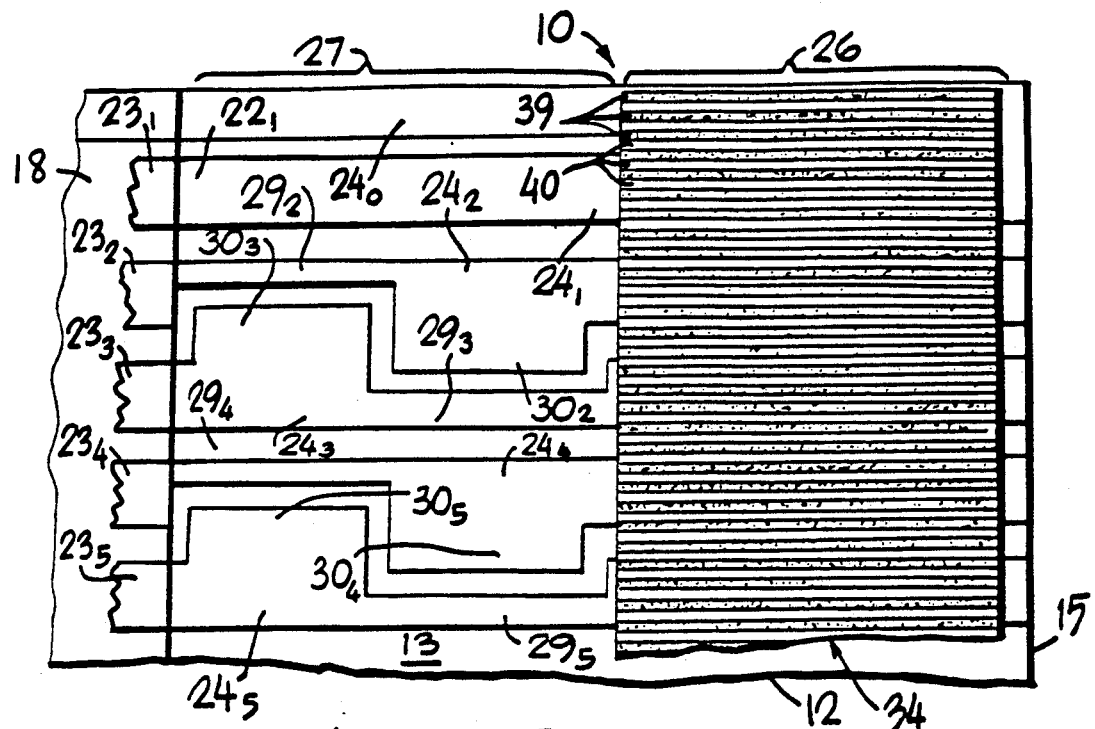
FIG. 7 is a plan view, greatly enlarged, of a portion of an assembly of a display-generating device of FIG. 1 and a connector element arranged for use in a digital display according to FIG. 5.
Figure 8:
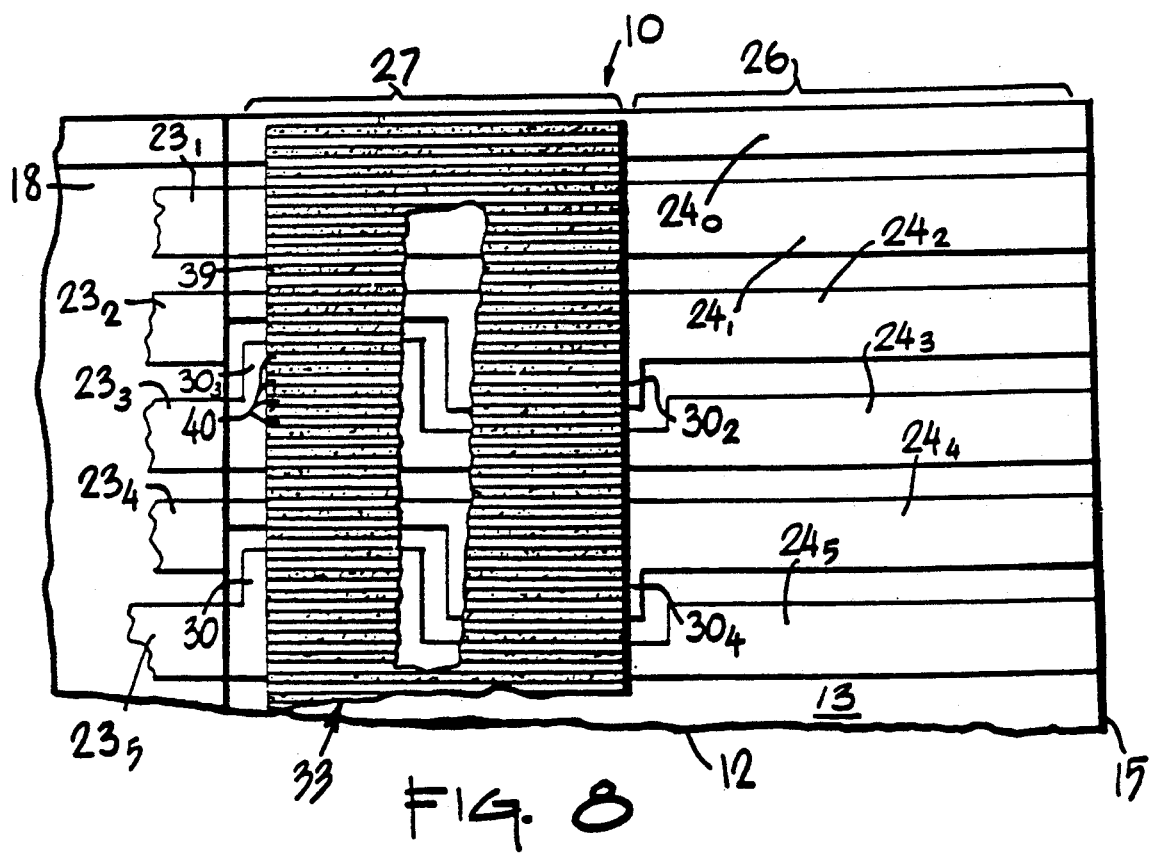
FIG. 8 is a plan view, greatly enlarged, of a portion of an assembly of a display-generating device of FIG. 1 and a connector element arranged for use in an analog display according to FIG. 3.

FIGS. 7 and 8 show a small portion of the display device 10 of FIG. 1 in greatly enlarged detail in order to explain the function of a laminated elastomeric connector element in combination with the connector strips of a display device to selectively create either an analog or a digital type of display assembly. The illustrated portion of the display element includes connector strips $24_1, 24_2, 24_3, 24_4,$ and $24_5$ and small portions of the adjacent ends of respective discrete display-generating electrode strips $23_1, 23_2, 23_3, 23_4,$ and $23_5$.

In FIG. 7, an elastomeric connector element 34 is disposed on the digital connection section 26. The connector element 34 consists of a large number of electrically insulating layers 39 alternating with electrically conductive layers 40. The layers extend transversely to the longitudinal dimension of the connector element. Since the connector strips 24 in the digital connection section 26 also extend transversely to the longitudinal dimension of the connector element, the edges of the connector strips are substantially parallel to the laminations of the connector element.

As shown in the drawing, the spacing between adjacent connector strips is several times the thickness of the individual laminations, which assures that at least one insulating layer 39 occurs between each two adjacent connector strips. In actual practice, there may be as many as four or five insulating layers in the space between adjacent connector strips, so that there can be no electrical connection between connector strips. At the same time, there are a comparable number of conductive layers 40 that contact each connector strip 24.

Figure 11:
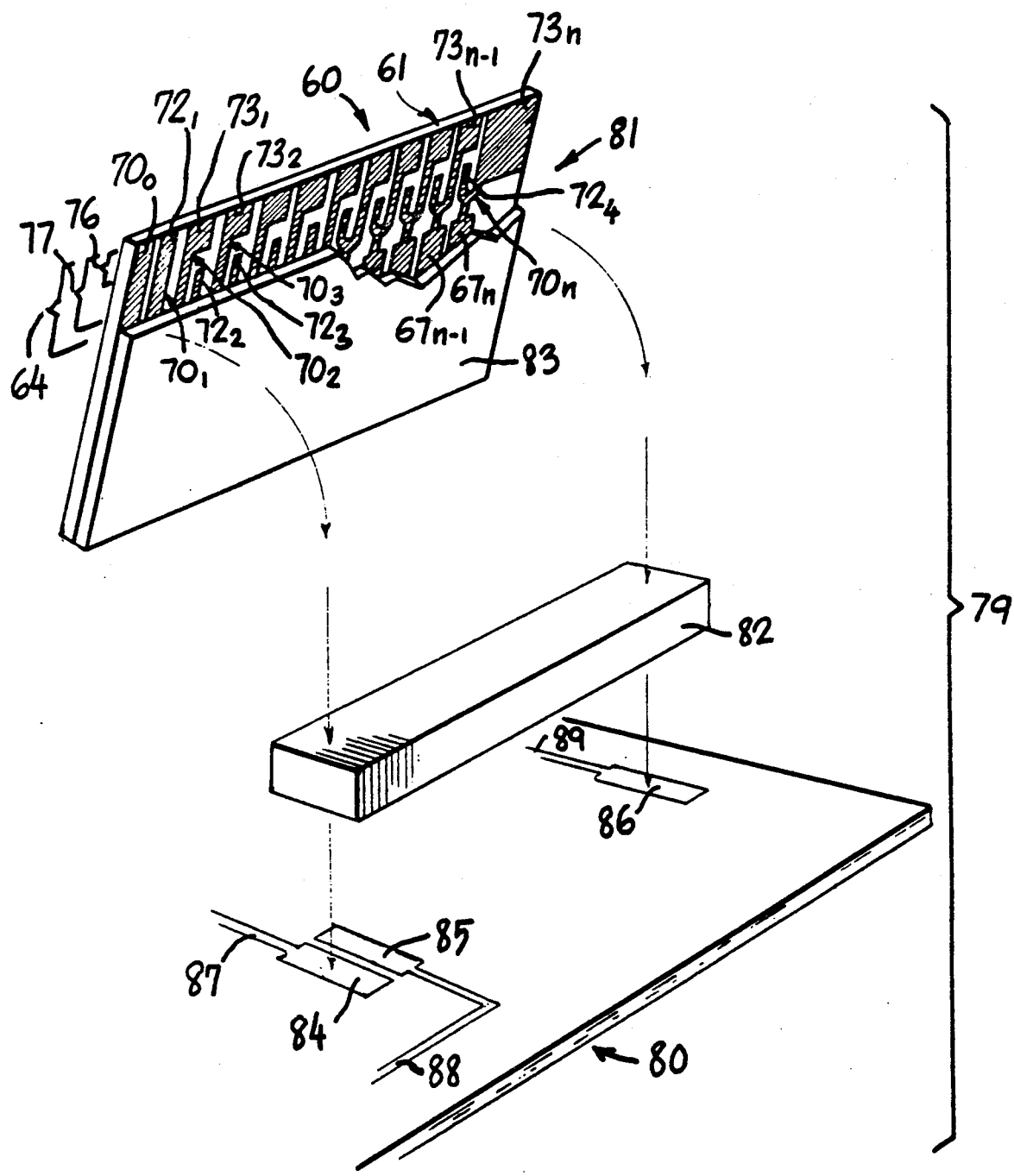
FIG. 11 is an exploded view of an assembly onto a printed circuit board of a display device using a modification of the display pattern element of FIG. 10.

As shown in FIG. 11, these conductive layers also electrically contact respective terminals that have been deposited on a printed circuit board or other support substrate at locations corresponding to the locations of the connector strips 24. In this way, each terminal can be electrically connected to its respective connector strip, and thereby to the respective discrete display-generating electrode strip. There is no connection, however, across the spaces separating the individual connector strips 24.

FIG. 8 shows the same portion of the display device of FIG. 1, but with a connector element 33 disposed on the analog connection section 27. This connector element is shown with a central region cut away to illustrate more clearly the relation between the insulating and conductive layers and the underlying connector strips 24.

Because the adjacent edges of connector strips $24_0$ and $24_1$ extend transversely to the longitudinal dimension of the analog connection section (and thus parallel to the laminations of the connector element 33), the connector element provides no electrical connection between connector strips $24_0$ and $24_1$. The same is true of connector strips $24_1$ and $24_2$. Connector strips $24_2$ and $24_3$, on the contrary, are provided with widened portions $30_2$ and $30_3$ that are aligned in the direction transverse to the longitudinal dimension of the analog connection section. In the longitudinal dimension of the transversely aligned portions there is at least one electrically conductive layer 40 that contacts both portion $30_2$ and portion $30_3$, thereby electrically connecting the connector strips $24_2$ and $24_3$. The edges between connector strips $24_3$ and $24_4$ are parallel and extend transversely, so there is at least one insulating layer 39 interposed to prevent electrical connection between these two connector strips. The transverse alignment between widened portions $30_4$ and $30_5$ results in an electrical connection between connector strips $24_4$ and $24_5$ in the same manner as between strips $24_2$ and $24_3$. In this way, the laminated connector element 33 positioned in analog connection section 27 creates alternate electrical connections and electrical non-connections between successive pairs of connector strips 24.

An inspection of FIG. 1 makes it clear that another connector element 33 positioned on the analog connection section 28 will produce electrical connections between connector strips $25_1$ and $25_2$, between connector strips $25_3$ and $25_4$, and so forth, while providing at least one insulating layer between connector strips $25_2$ and $25_3$, between connector strips $25_4$ and $25_5$, and so on. As a result, the two analog connector elements 33, one at each end of the discrete display-generating electrode strips 23, produce a zig-zag connection path extending from connector strip $24_1$ through discrete display-generating electrode strip $23_1$ to a junction between connector strips $25_1$ and $25_2$, then through display-generating electrode strip $23_2$ to a junction between connector strips $24_2$ and $24_3$, and so on, until eventually reaching connector strip $24_n$.

The width and thickness of each display-generating electrode strip $23_1$, $23_2$, $23_3$, ..., $23_n$ are chosen to produce a desired electrical resistance per unit length of the strip. Then, just as in the prior art single-purpose analog zig-zag pattern liquid crystal display devices previously described, a potential difference imposed between the two connector strips $24_1$ and $24_n$ will develop a voltage gradient along the zig-zag path, so that an intermediate voltage applied to the conductive surface 19a facing the zig-zag pattern will cause a visual difference to appear in the liquid crystal material 22 between the plates 12 and 18 at the location on the zig-zag pattern having the same intermediate voltage.

When the same display device 10 is assembled as a digital liquid crystal display, with a connector element 34 positioned in the digital connection section 26, as described above, a voltage applied to a terminal located on, for example a circuit board and contacting an exposed portion of the connector element in alignment with the connector strip $23_0$ will appear on the address plate 21. In the same way, a voltage applied to another terminal contacting an exposed surface of the connector element in alignment with one of the connector strips $24_1$ to $24_n$ will appear, essentially undiminished, along the entire length of the corresponding display-generating electrode strip despite the resistance of the strip, because there is minimal current drain through the liquid crystal material. In other words, the display-generating electrode strips $23_1$, $23_2$, $23_3$, ..., $23_n$ behave essentially as non-resistive strips when the display element 10 is used in the digital mode.

The display pattern element of the present invention also can be designed for use as part either of a same type of digital display device or of an analog display device of the type in which parallel elongated display-generating conductive strips are connected at one end to a resistor element extending along one edge of the display region.

Figure 9:
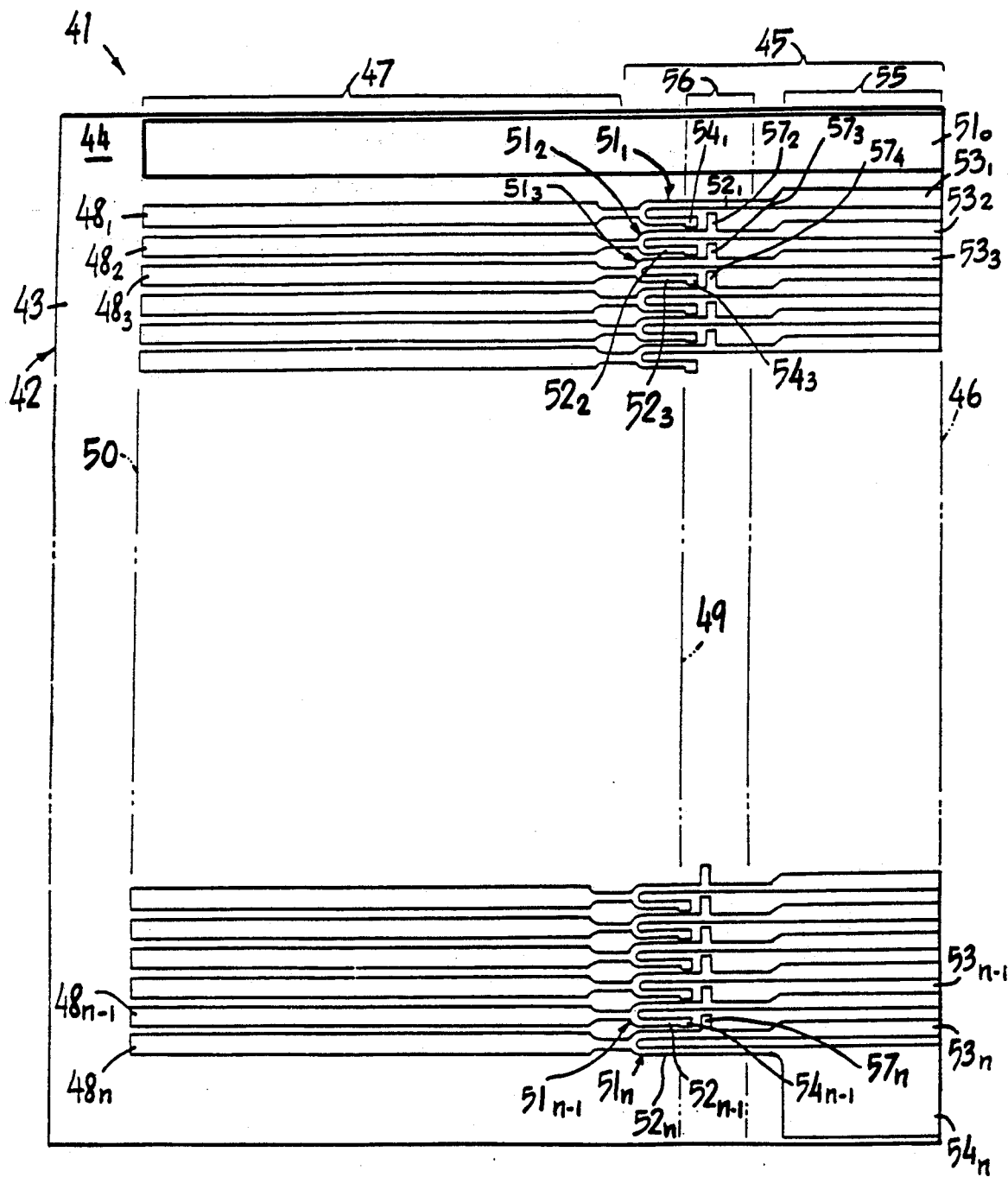
FIG. 9 is a plan view of an alternative embodiment of a display-generating electrode pattern element.

FIG. 9 illustrates an alternative embodiment of a display pattern element 41 arranged for such use. As in the first embodiment of FIGS. 1–8, the display pattern element 41 includes an electrically insulating substrate 42 in the form of a flat rectangular plate 43 having a surface 44. The second plate covering the display region is omitted in FIG. 9 to simplify the illustration. It will be appreciated, however, that a second plate will be mounted over the display region of this pattern element in the same manner as in the first embodiment to create a completed display device.

The pattern of this embodiment has no second connection region. Instead, plate 43 is divided into a single elongated connection region 45 extending adjacent to one edge 46 of the plate and a display region 47 located adjacent to the connection region. A plurality of parallel spaced-apart display-generating electrodes in the form of strips $48_1$, $48_2$, $48_3$, ..., $48_n$ extend across the display region from one edge 49 of the region to an opposite edge 50 to form a rectangular array. In this embodiment, however, each display-generating electrode strip $48_1$, $48_2$, $48_3$, ..., $48_n$ is connected to only a respective single connector strip $51_1$, $51_2$, $51_3$, ..., $51_n$ extending across connection region 45 to the edge 46 of plate 43. The connector strips $51_1$, $51_2$, $51_3$, ..., $51_n$ include respective elongated U-shaped resistive portions $52_1$, $52_2$, $52_3$, ..., $52_n$, having first enlarged end portions $53_1$, $53_2$, $53_3$, ..., $53_n$ and second enlarged end portions $54_1, 54_2, 54_3, \ldots, 54_n$. The bights of the U-shaped resistive portions are connected to the adjacent ends of respective display-generating electrode strips 48. In addition, as in the first embodiment, a connector strip $51_0$ extends across the first connection region 45 plus the display region 47 to provide an electrical path to a conductive address plate (not shown) of a completed display device.

As in the previously described embodiment, the connection region 45 is subdivided into a digital connection section 55 and an analog connection section 56. The only portions of connector strips $51_1, 51_2, 51_3, \ldots, 51_n$ in digital connection section 55 are the first enlarged end portions $53_1, 53_2, 53_3, \ldots, 53_n$, which have constant widths and parallel edges that extend transversely to the longitudinal direction of connection region 45. Thus, assembly with a laminated connector element (not shown in FIG. 9) will create the same type of digital display device as the first embodiment of FIG. 1.

In the analog connection section 56, the connector strips $51_2, 51_3, \ldots, 51_n$ have respective widened portions $57_2, 57_3, \ldots, 57_n$ that are transversely aligned with the second enlarged end portions $54_1, 54_2, \ldots, 54_{n-1}$ of the respective preceding connector strips $51_1, 51_2, \ldots, 51_{n-1}$. Thus, it is clear from inspection of the analog connection section 56 of FIG. 9 that placing a laminated connector element (not shown in FIG. 9) in the analog connection section 56 will create electrical connections between the second enlarged end portion $54_1$ of connector strip $51_1$ and widened portion $57_2$ of connector strip $51_2$, between the second enlarged end portion $54_2$ of connector strip $51_2$ and widened portion $57_3$ of connector strip $51_3$, and so forth, to form a continuous resistor that extends along an edge of the display region 48. If two external terminals (not shown in FIG. 9) are arranged to contact respective end portions of such a laminated connector element (not shown) aligned with first enlarged portion $53_1$ and second enlarged portion $53_n$, respectively, a potential difference applied across these two terminals will produce incremental intermediate voltages on the display-generating electrode strips $48_1, 48_2, 48_3, \ldots, 48_n$ that are substantially equal to the voltages at the points where the display-generating electrode strips are connected to the bights of the U-shaped resistive portions of the respective connector strips $51_1, 51_2, 51_3, \ldots, 51_n$.

Figure 10:
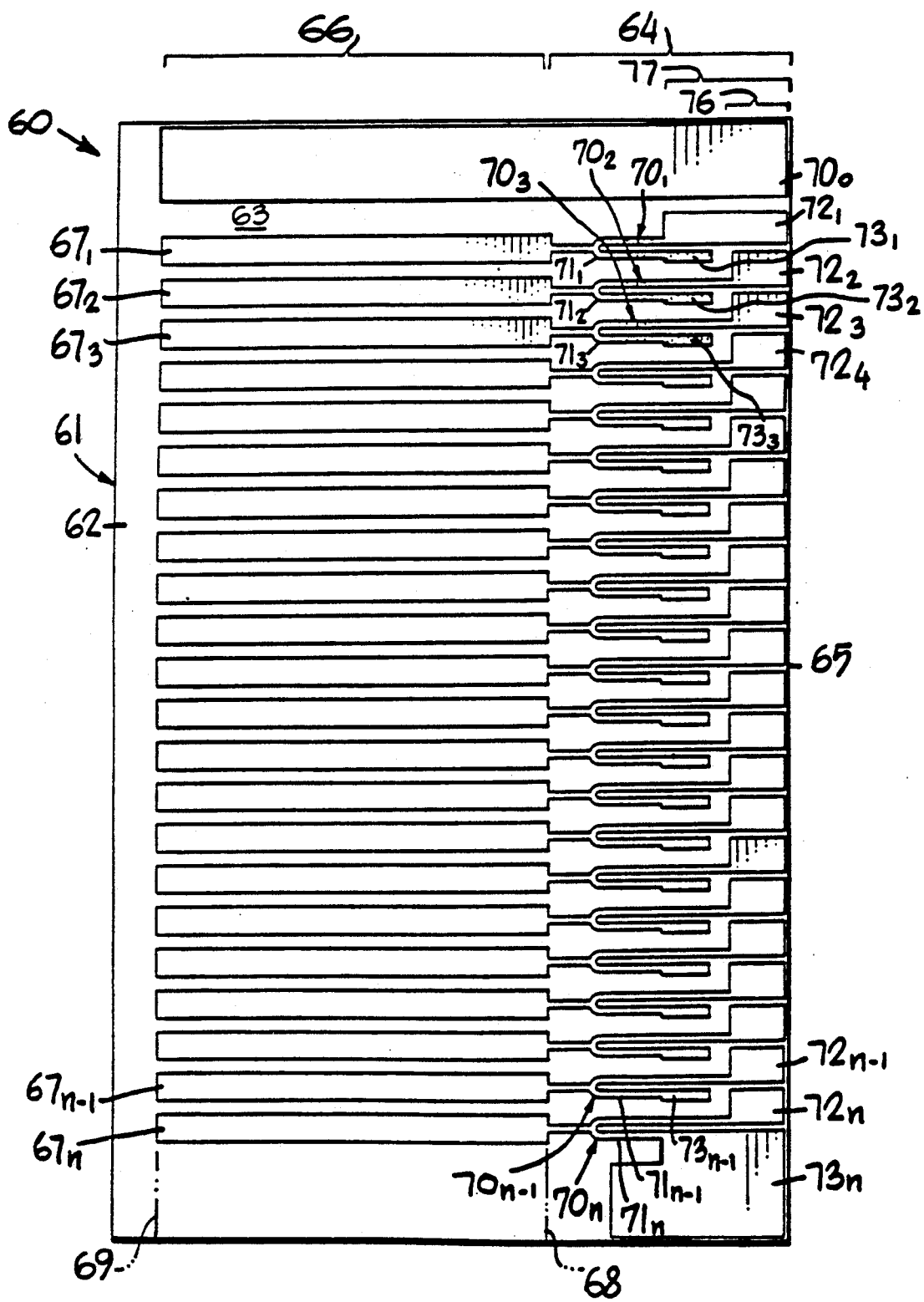
FIG. 10 is a plan view of a second alternative embodiment of a display-generating electrode pattern element.

FIG. 10 illustrates another alternative embodiment of a display pattern element according to the invention. In this embodiment, a display pattern element 60 is arranged similarly to the display pattern element 41 of FIG. 9 and functions in a similar way. The only difference is in the configuration of the analog connection section. The display pattern element 60 includes an electrically insulating substrate 61 in the form of a flat rectangular plate 62 having a surface 63. Plate 62 also is divided into a single elongated connection region 64 extending adjacent to one edge 65 of the plate and a display region 66 located adjacent to the connection region. As with FIG. 9, a second plate will be mounted to cover the display region 66 of the display pattern element 60, with liquid crystal material between the plates, to complete the display device.

A plurality of parallel spaced-apart display-generating electrodes in the form of strips $67_1, 67_2, 67_3, \ldots, 67_n$ extend across the display region of plate 62 from one edge 68 of the region to an opposite edge 69 to form a rectangular array. Each display-generating electrode strip $67_1, 67_2, 67_3, \ldots, 67_n$ is connected to a respective single connector strip $70_1, 70_2, 70_3, \ldots, 70_n$ extending across connection region 64 to the edge 65 of plate 62. In addition, as in the first embodiment, a connector strip $70_0$ extends across the first connection region 64 plus the display region 66 to provide an electrical path to a conductive address plate (not shown) of a completed display device.

Again, the connector strips $70_1, 70_2, 70_3, \ldots, 70_n$ have respective elongated U-shaped resistive portions $71_1, 71_2, 71_3, \ldots, 71_n$ provided with first enlarged end portions $72_1, 72_2, 72_3, \ldots, 72_n$ and second enlarged end portions $73_1, 73_2, 73_3, \ldots, 73_n$, the bights of the U-shaped resistive portions being connected to the adjacent ends of respective display-generating electrode strips.

As in the previously described embodiments, the connection region 64 is subdivided into a digital connection section 76 that is approximately one-quarter the width of the connection region 64 and an analog connection section 77 that is approximately one-half the width of the connection region. As before, the only portions of connector strips $70_1, 70_2, 70_3, \ldots, 70_n$ in digital connection section 76 are the first enlarged end portions $72_1, 72_2, 72_3, \ldots, 72_n$, which have constant widths and parallel edges that extend transversely to the longitudinal direction of connection region 64. Thus, assembly with a laminated connector element (not shown in FIG. 10) having a width no greater than the width of the digital connection section 76 will create the same type of digital display as provided by the first and second embodiments.

To create an analog display requires assembly with a laminated connector element (not shown in FIG. 10) that is at least wide enough to span the lateral gap between the second enlarged end portions $73_1, 73_2, 73_3, \ldots, 73_{n-1}$ of the respective connector strips $70_1, 70_2, 70_3, \ldots, 70_{n-1}$ and the first enlarged end portions $72_2, 72_3, 72_4, \ldots, 72_n$ of the respective following connector strips $70_2, 70_3, 70_4, \ldots, 70_n$ to provide an electrical connection between these portions. Thus, the analog connection configuration of the embodiment of FIG. 10 functions the same way as the analog connection configuration of FIG. 9. Comparison of the two figures shows, however, that the configuration of FIG. 10 provides more contact length between the conductive laminations of a connector element and the laterally aligned first and second enlarged end portions of successive connector strips, yet it permits a narrower connection region than does the configuration of FIG. 9.

FIG. 11 is an exploded view of an assembly 79 onto a printed circuit board 80 of a display device 81 using a slight modification of the display pattern element 60 of FIG. 10 and a single laminated connector element 82 to produce an analog display. As in the first embodiment, display device 81 comprises a second plate 83 mounted over the display region of the substrate 61 of the display pattern element 60, with a liquid crystal material (not shown) sealed between a conductive surface (not shown) of the second plate and the display pattern deposited on the substrate 61.

In FIG. 11, the display device (shown lifted and rotated out of position) is mounted face down on the circuit board 80 in a location such that connector strip $70_0$ is aligned with a terminal 84 previously placed on the circuit board, enlarged end $72_1$ of connector strip $70_1$ is aligned with a terminal 85, and enlarged end $73_n$ of connector strip $70_n$ is aligned with a terminal 86. The laminated connector element 82 disposed in the connection region 64 provides an electrical connection between the connector strips $70_0$, $70_1$, and $70_n$ and the terminals 84, 85, and 86, respectively, with no need to make any permanent connections. The laminated connector element also connects transversely aligned end portions $73_1$ and $72_2$, $73_2$ and $72_3$, ..., $73_{n-1}$ and $72_n$ to produce a continuous resistor element extending from portion $72_1$ to portion $73_n$.

A conductive path 87 leads from terminal 84 to an appropriate voltage source, typically a variable source for delivering a selectively variable voltage to the address plate of the display device. Conductive paths 88 and 89 lead from terminals 85 and 86, respectively, to another appropriate voltage source, typically a source that provides a constant potential difference across the resistive path created by the laminated connector element between successive connector strips from enlarged portion $72_1$ to enlarged portion $73_n$. In this way, changes in the voltage applied to terminal 84 will change which display-generating strip 67 has the same voltage as the address plate and, consequently, will change the location of a line on the display. Thus, the position of the line will be an analog of the varying value of the voltage applied to the terminal 84.

In the arrangement of FIG. 11, since the second plate 83 is placed against the circuit board 80, the substrate 61 should be transparent so that the display can be viewed through the back surface of the substrate. For best visibility the second plate 83 should have a reflective surface in this arrangement. This can be provided most easily by adhering a reflective metal foil (not shown) to the exposed surface of plate 83. Of course, plate 83 could be made of metal, or the conductive inner surface that serves as the address plate could be a reflective deposited metal film. As mentioned above, however, it is preferred that both the substrate and the second plate be made of a transparent material such as glass and that both the low resistance pattern deposited on the substrate and the conductive material on the inner surface of the second plate also be transparent. Then either exposed surface of the device can be used as the viewing surface, and either the opposite surface can be backlighted or a reflective foil can be attached to the opposite surface, depending on the best arrangement for a particular application.

Finally, it will be appreciated that the arrangement of FIG. 11 could be used for a digital display by providing additional terminals on the circuit board in alignment with each enlarged portion $73_1$ to $73_{n-1}$ and shifting the connector element 82 laterally outward so that it contacts the connector strips on the substrate 61 only in the digital connection section 76. That is, the connector element should not bridge between transversely aligned portions of adjacent connector strips in the analog connection section 77.

In all of the described embodiments it is possible to combine both analog and digital display modes in a single device by placing a laminated connector element in each analog connection section for a portion or portions of the length of each connection region and another laminated connector element in the digital connection section of the remaining portion or portions of the length of the corresponding connection region.

The foregoing description and accompanying drawings of preferred embodiments of the invention are intended to provide examples of applications of the invention without limiting the scope permitted by the following claims.

I CLAIM:
1. A display pattern element that is adapted for use in either an analog or a digital liquid crystal display device, the display pattern element comprising:
   an electrically insulating substrate having a surface with a display region and an elongated connection region outside the display region, the connection region including a longitudinally extending digital connection section and a longitudinally extending analog connection section;
   a plurality of discrete display-generating electrodes composed of an electrically conductive material, the electrodes being disposed on the surface of the substrate in spaced-apart relation in a predetermined pattern in the display region; and
   a plurality of electrically conductive connector strips disposed on the surface of the substrate in the connection region and extending transversely in spaced-apart non-contacting relation in both the analog and digital connection sections, each one of the connector strips being uniquely connected to a respective one of the display-generating electrodes, and wherein all of the connector strips are formed with edges that extend only transversely to the longitudinal dimension of the connection region in the digital connection section, and wherein at least some pairs of adjacent connector strips are formed with portions that are aligned in the transverse direction of the connection region in the analog connection section such that a transverse line will intersect said portions of both connector strips of each pair in the analog connection section.

2. The display pattern element of claim 1 wherein the discrete display-generating electrodes are arranged in a rectangular array of parallel elongated strips, the connection region extending alongside the display region adjacent to one end of and perpendicularly to the display-generating electrode strips, with each connector strip forming an extension of a respective one of the discrete display-generating electrode strips.

3. The display pattern element of claim 1 wherein the substrate has an additional elongated connection region extending alongside the other ends of the discrete display-generating strips, the additional connection region also having a plurality of connector strips equal to the number of display-generating electrodes and including an analog connection section wherein portions of adjacent pairs of the connector strips are aligned transversely to the longitudinal dimension of the connection region, and the transversely aligned portions of adjacent pairs of connector strips in the analog connection section of the first-mentioned connection region alternate with the transversely aligned portions of adjacent pairs of connector strips in the analog connection section of the additional connection region.

4. The display pattern element of claim 2 wherein each connector strip includes an elongated resistive portion, each end of which is transversely aligned with an end of an adjacent connector strip and an intermediate portion of which is connected to the adjacent end of a corresponding one of the discrete display-generating electrode strips.

5. The display pattern element of claim 4 wherein the elongated resistive portion of each connector strip has a U-shape, and the intermediate portion connected to the adjacent end of a display-generating electrode strip is located at the bight of the U-shape.

6. A convertible liquid crystal analog-digital display device including a display pattern element comprising an electrically insulating substrate having a surface with a display region and an elongated connection region outside the display region, the connection region being subdivided into a longitudinally extending digital connection section and a longitudinally extending analog connection section;
> a plurality of discrete display-generating electrodes composed of an electrically conductive material, the display-generating electrodes being disposed on the surface of the substrate in spaced-apart relation in a predetermined pattern in the display region; and
> a plurality of electrically conductive connector strips disposed on the substrate in the connection region and extending in spaced-apart non-contacting relation in both the analog and digital connection sections, each one of the connector strips being connected to a respective one of the display-generating electrodes, and wherein all of the connector strips are formed with edges that extend only transversely to the longitudinal dimension of the connection region in the digital connection section, and wherein at least some pairs of adjacent connector strips are formed with edge portions that are aligned in the transverse direction of the connection region in the analog connection section such that a transverse line will intersect portions of both connector strips of each pair in the analog connection section, and wherein the display device further comprises:
> an elongated connector element disposed on the substrate and extending longitudinally in the connection region across a plurality of the connector strips, the connector element being formed of transverse laminations of alternate insulating and conductive films, the thicknesses of which are less than the spacing between adjacent connector strips in the digital connection section, and the width of the connector element being greater than the spacing between the transversely aligned portions of the connector strips in the analog connection section, such that when the connector element is located in the digital connection section it provides no electrical connection between the connector strips, and when the connector element is located in the analog connection section at least one of the conductive laminations will contact the transversely aligned portions of an adjacent pair of connector strips to provide an electrical connection between the respective discrete display-generating electrodes connected to said pair of connector strips.

7. The display device of claim 6 wherein the discrete display-generating electrodes are arranged in a rectangular array of parallel elongated strips, the connection region extending alongside the display region adjacent to one end of and perpendicularly to the display-generating electrode strips, with each connector strip forming an extension of a respective one of the discrete display-generating electrode strips.

8. The display device of claim 7 wherein each connector strip includes an elongated resistive portion, each end of which is transversely aligned with an end of an adjacent connector strip and an intermediate portion of which is connected to the adjacent end of a corresponding one of the discrete display-generating electrodes, such that when the laminated connector element is disposed in the analog connection section at the one end of the display-generating electrodes the connector element will electrically connect the transversely aligned ends of successive resistive portions of adjacent connector strips to create a continuous resistive element extending along one side of the display region and connected at spaced intervals along the resistive element to successive discrete display-generating electrode strips.

9. The display device of claim 7 wherein the substrate has an additional elongated connection region extending alongside the other ends of the discrete display-generating strips, the additional connection region also having a plurality of connector strips equal to the number of display-generating electrodes and including an analog connection section wherein portions of adjacent pairs of the connector strips are aligned in the transverse direction of the additional connection region such that a transverse line will intersect said portions of both strips of each pair in the additional analog connection section, and said transversely aligned portions of adjacent pairs of connector strips are arranged between alternate pairs of discrete display-generating strips at the opposite ends of the discrete display-generating strips, so that laminated connector elements disposed in the analog connection sections at the opposite ends of the display elements will electrically connect the opposite ends of alternate pairs of display elements to create a continuous zig-zag resistive analog display element.

* * * * *